United States Patent
Liang et al.

(10) Patent No.: US 10,978,271 B2
(45) Date of Patent: Apr. 13, 2021

(54) ELECTRON IMAGING METHOD AND SYSTEM

(71) Applicant: INSTITUT NATIONAL DE LA RECHERCHE SCIENTIFIQUE (INRS), Quebec (CA)

(72) Inventors: Jinyang Liang, Boucherville (CA); Xianglei Liu, Longueuil (CA); Aycan Yurtsever, Longueuil (CA)

(73) Assignee: INSTITUT NATIONAL DE LA RECHERCHE SCIENTIFIQUE (INRS), Quebec (CA)

(*) Notice: Subject to any disclaimer, the term of this patent is extended or adjusted under 35 U.S.C. 154(b) by 0 days.

(21) Appl. No.: 16/689,680

(22) Filed: Nov. 20, 2019

(65) Prior Publication Data

US 2020/0161084 A1  May 21, 2020

Related U.S. Application Data

(60) Provisional application No. 62/769,663, filed on Nov. 20, 2018.

(51) Int. Cl.
*H01J 37/22* (2006.01)
*H01J 37/26* (2006.01)

(52) U.S. Cl.
CPC .......... *H01J 37/222* (2013.01); *H01J 37/26* (2013.01); *H01J 2237/221* (2013.01)

(58) Field of Classification Search
CPC ..... H01J 37/222; H01J 37/26; H01J 2237/221
See application file for complete search history.

(56) References Cited

PUBLICATIONS

Zewail, A.H., The birth of molecules. Sci. Am, 1990. 263(6): p. 76-83.
Zewail, A.H., Femtochemistry: Atomic-scale dynamics of the chemical bond using ultrafast lasers (Nobel Lecture). Angew. Chem. Int. Ed, 2000, 39(15): p. 2586-2631.
Elsayed-Ali, H., et al., Time-resolved observation of electron-phonon relaxation in copper. Phys. Rev. Lett, 1987. 58(12): p. 1212.
Cavalleri, A., et al., Evidence for a structurally-driven insulator-to-metal transition in VO 2: A view from the ultrafast timescale. Phys. Rev. B, 2004. 70(16): p. 161102.
Sjodin, T., H. Petek, and H.-L. Dai, Ultrafast carrier dynamics in silicon: A two-color transient reflection grating study on a (111) surface. Phys. Rev. Lett, 1998. 81(25): p. 5664.
(Continued)

*Primary Examiner* — Nicole M Ippolito
*Assistant Examiner* — Hanway Chang
(74) *Attorney, Agent, or Firm* — Fasken Martineau Dumoulin LLP; Serge Lapointe

(57) ABSTRACT

A transmission electron microscopy system for imaging a sample, comprising: a pulse generator for generating an initial electron pulse towards the sample, the initial electron pulse to be propagated through the sample to obtain a transmitted electron pulse; an encoding device for encoding the transmitted electron pulse according to a predefined pattern to obtain an encoded electron pulse; a shearing device for temporally shearing the encoded electron pulse in a given direction to obtain a given electron pulse; a detector for detecting the given electron pulse to obtain a single image of the sample; and a datacube generator for determining a spatiotemporal datacube from the single image using the predefined pattern, and outputting the spatiotemporal datacube.

20 Claims, 11 Drawing Sheets

(56) References Cited

PUBLICATIONS

Gedik, N., et al., Diffusion of nonequilibrium quasi-particles in a cuprate superconductor. Science, 2003. 300(5624): p. 1410-1412.

Corkum; P.B. and F. Krausz, Attosecond science. Nat. Phys, 2007. 3(6): p. 381.

Meurig, T.J., 4D electron microscopy: imaging in space and time. 2009: World Scientific.

Yurtsever, A., J.S. Baskin, and A.H. Zewail, Entangled nanoparticles: Discovery by visualization in 4D electron microscopy. Nano Lett, 2012. 12(9): p. 5027-5032.

LaGrange, T., et al., Single-shot dynamic transmission electron microscopy. Appl. Phys. Lett, 2006. 89(4): p. 044105.

Kim, J.S., et al., Imaging of transient structures using nanosecond in situ TEM. Science, 2008. 321(5895): p. 1472-1475.

Feist, A., et al., Ultrafast transmission electron microscopy using a laser-driven field emitter: Femtosecond resolution with a high coherence electron beam. Ultramicroscopy, 2017. 176: p. 63-73.

Bücker, K., et al., Electron beam dynamics in an ultrafast transmission electron microscope with Wehnelt electrode. Ultramicroscopy, 2016, 171: p. 8-18.

Musumeci, P., D. Cesar, and J. Maxson, Double-shot MeV electron diffraction and microscopy, Struct Dyn, 2017. 4(4): p. 044025.

Gao, L., et al,, Single-shot compressed ultrafast photography at one hundred billion frames per second. Nature, 2014. 516(7529): p. 74-7.

Liang, J., et al., Single-shot real-time video recording of a photonic Mach cone induced by a scattered light pulse. Sci Adv, 2017. 3(1): p. e1601814.

Li, Z., et al., Single-shot tomographic movies of evolving light-velocity objects. Nat. Commun, 2014. 5: p. 3085.

Ehn, A., et al., FRAME: femtosecond videography for atomic and molecular dynamics. Light Sci Appl., 2017. 6: p. e17045.

Mochizuki, F., et al., A multi-aperture compressive time-of-flight CMOS imager for pixel-wise coarse histogram acquisition. Proc. 2015 IISW, 2015: p. 178-181.

Yurtsever, A. and A.H. Zewail, Direct visualization of near-fields in nanoplasmonics and nanophotonics. Nano Lett, 2012. 12(6): p. 3334-8.

Flannigan, D.J., et al., Nanomechanical motions of cantilevers: direct imaging in real space and time with 4D electron microscopy. Nano Lett, 2009. 9(2): p. 875-81.

Flannigan, D.J., et al., Nanornechanical motions of cantilevers: direct imaging in real space and time with 4D electron microscopy. Nano Lett, 2009. 9(2): p. 875-81.

Bioucas-Dias, J.M. and M.A. Figueiredo, A new TwIST: two-step iterative shrinkage/thresholding algorithms for image restoration. IEEE Trans. Image Process, 2007. 16(12): p. 2992-3004.

Strong, D. and T. Chan, Edge-preserving and scale-dependent properties of total variation regularization. Inverse problems, 2003. 19(6): p. S165.

Elad, M., Optimized projections for compressed sensing. IEEE Trans. Signal Process, 2007. 55(12): p. 5695-5702.

Tsiligianni, E,V., L.P. Kondi, and A.K. Katsaggelos, Construction of incoherent unit norm tight frames with application to compressed sensing. IEEE Trans. Inf. Theory, 2014. 60(4): p. 2319-2330.

Koller, R., et al., High spatio-temporal resolution video with compressed sensing. Opt. Express, 2015. 23(12): p. 15992-16007.

Bernstein, D.S., Matrix mathematics: Theory, facts, and formulas with application to linear systems theory. vol. 41. 2005: Princeton University Press Princeton.

Abolghasemi, V., et al. On optimization of the measurement matrix for compressive sensing. In Signal Processing Conference, 2010 18th European. 2010. IEEE.

Abolghasemi, V., S. Ferdowsi, and S. Sanei, A gradient-based alternating minimization approach for optimization of the measurement matrix in compressive sensing. Signal Processing, 2012. 92(4): p. 999-1009.

Kellman, P. and E.R. McVeigh, Image reconstruction in SNR units: a general method for SNR measurement. Magn. Reson. Med, 2005. 54(6): p. 1439-1447.

Wang, Z., et al., Image quality assessment: from error visibility to structural similarity. IEEE Trans. Image Process, 2004, 13(4): p. 600-612.

Lustig, M., D. Donoho, and J.M. Pauly; Sparse MRI: The application of compressed sensing for rapid MR imaging, Magn. Reson. Med, 2007. 58(6): p. 1182-1195.

Lustig, M., et al., Compressed sensing MRI. IEEE Signal Process. Mag, 2008. 25(2): p. 72-82.

ELECTRON IMAGING METHOD AND SYSTEM

CROSS-REFERENCE TO RELATED APPLICATIONS

The present patent application claims the benefit of U.S. Prov. Ser. No. 62/769,663 filed Nov. 20, 2018.

TECHNICAL FIELD

The present invention relates to the field of electron imaging methods and systems, and more particularly to transmission electron microscopy systems and methods.

BACKGROUND

Developing spatiotemporal imaging techniques having both high spatial and temporal resolutions has been traditionally challenging because of the limitations of the elementary particles used in the imaging processes. Photons and electrons, the two particles that account for the most, if not all, imaging technologies, are dissimilar in terms of the spatiotemporal domains they can access. Photons, with no dispersion in free space and with no elementary charge, excel in forming ultrafast pulses that can propagate long distances. Fast electrons, on the other hand, with their picometer wavelengths and strong interaction cross-sections, excel in forming images with the highest spatial resolution (sub-angstrom) available today. Methodologies based on the former, such as ultrafast optical spectroscopy, have offered access to the first "moments" of fundamentally significant phenomena, including the birth of chemical species and evolution of molecular bonds, phonon dynamics, and valance-band electronic transitions. While excelling in temporal resolution, photons lack the extreme spatial resolution that electrons can achieve in transmission electron microscopy (TEM).

In the last decade, it was made possible to make photons and electrons work together in one microscope to achieve combined spatiotemporal resolution that was not possible before. At the California Institute of Technology, a TEM system was modified to merge it with a femtosecond laser. In such an ultrafast TEM, instead of using continuous electron beams in conventional TEM systems, ultrashort electron pulses created by the photoelectric effect are used for imaging, while optical pulses are used to clock the sample synchronously. With such a pump-probe scheme, it is possible to achieve few-nanometers real-space resolution combined with sub-picosecond temporal resolution, which represents the current resolution limits in spatiotemporal imaging. Complementarily, another photon-electron imaging methodology was developed at the Lawrence Livermore National Laboratory (LLNL). This technique is based on using several intense electron pulses to image a photo-excited sample and then, deflecting these pulses successively to fill a CCD camera with several frames. This single-shot, real-time (i.e., duration in which the event occurs), ultrafast imaging approach enables to visualize irreversible phenomena, albeit with limited sequence depth (i.e., the maximum number of frames that can be captured in one acquisition) with real-space resolution of tens of nanometers and temporal resolution in the nanoseconds range. However, higher spatial and temporal resolutions would be desirable.

Therefore, there is a need for an improved electron imaging method and system.

SUMMARY

In the following, there is described a novel methodology that combines the electron-photon spatiotemporal imaging methods with computational image reconstruction algorithms based on compressed sensing (CS).

According to a first broad aspect, there is provided a transmission electron microscopy system for imaging a sample, comprising: a pulse generator for generating an initial electron pulse towards the sample, the initial electron pulse propagating through the sample to obtain a transmitted electron pulse; an encoding device for encoding the transmitted electron pulse according to a predefined pattern to obtain an encoded electron pulse; a shearing device for temporally shearing the encoded electron pulse to obtain a sheared electron pulse; a detector for detecting the sheared electron pulse to obtain a single image of the sample; and a datacube generator for determining a spatiotemporal datacube from the single image using the predefined pattern and outputting the spatiotemporal datacube.

In one embodiment, the pulse generator comprises a photocathode and a pulsed light source for generating an optical pulse towards the photocathode to generate the initial electron pulse.

In one embodiment, the encoding device comprises a mask having the predefined pattern.

In one embodiment, the shearing device comprises a pair of electrodes connectable to a source of electrical power and configured for applying a time-varying shearing force on electrons contained in the encoded electron pulse.

In one embodiment, the detector comprises charge-coupled device detector for generating the single image of the sample via spatiotemporal integration.

In one embodiment, the transmission electron microscopy system further comprises a condenser lens device positioned between the pulse generator and the sample for focusing the initial electron pulse onto the sample.

In one embodiment, the transmission electron microscopy system further comprises a projection lens device positioned between the sample and the encoding device for focusing the transmitted electron pulse onto the detector.

According to another broad aspect, there is provided a transmission electron microscopy method for imaging a sample, comprising: generating an initial electron pulse and propagating the initial electron pulse through the sample, thereby obtaining a transmitted electron pulse; encoding the transmitted electron pulse according to a predefined pattern, thereby obtaining an encoded electron pulse; temporally shearing the encoded electron pulse, thereby obtaining a sheared electron pulse; detecting the sheared electron pulse, thereby obtaining a single image of the sample; and determining a spatiotemporal datacube from the single image using the predefined pattern; and outputting the spatiotemporal datacube.

In one embodiment, the step of generating the initial electron pulse comprises: generating an optical pulse; and propagating the optical pulse towards a photocathode, thereby generating the initial electron pulse.

In one embodiment, the step of encoding the transmitted electron pulse comprises propagating the transmitted electron pulse through a mask having the predefined pattern.

In one embodiment, the step of temporally shearing the encoded electron pulse comprises applying a time-varying shear force on electrons contained in the encoded electron pulse by applying a time-varying voltage to a pair of electrodes.

In one embodiment, the step of detecting the sheared electron pulse is performed using a charge-coupled device configured for generating the single image of the sample via spatiotemporal integration.

In one embodiment, the transmission electron microscopy method further comprises focusing the initial electron pulse onto the sample.

In one embodiment, the transmission electron microscopy method further comprises focusing the transmitted electron pulse onto the detector.

According to a further embodiment, there is provided a transmission electron microscopy system for imaging a sample, comprising: a pulse generator for generating an initial electron pulse towards the sample, the initial electron pulse propagating through the sample to obtain a transmitted electron pulse; a first shearing device for temporally shearing the transmitted electron pulse in a first direction to obtain a sheared electron pulse; an encoding device for encoding the sheared electron pulse according to a predefined pattern to obtain an encoded electron pulse; a second shearing device for temporally shearing the encoded electron pulse in a second direction different from the first direction to obtain a processed electron pulse; a detector for detecting the processed electron pulse to obtain a single image of the sample; and a datacube generator for determining a spatiotemporal datacube from the single image using the predefined pattern and outputting the spatiotemporal datacube.

In one embodiment, the pulse generator comprises a photocathode and a pulsed light source for generating an optical pulse towards the photocathode to generate the initial electron pulse.

In one embodiment, the encoding device comprises a mask having the predefined pattern.

In one embodiment, the first and second shearing devices each comprise a respective pair of electrodes connectable to a source of electrical power and configured for applying a respective time-varying shearing force on electrons contained in the transmitted electron pulse and the encoded electron pulse, respectively.

In one embodiment, the detector comprises charge-coupled device detector for generating the single image of the sample via spatiotemporal integration.

In one embodiment, the transmission electron microscopy system further comprises a condenser lens device positioned between the pulse generator and the sample for focusing the initial electron pulse onto the sample.

In one embodiment, the transmission electron microscopy system further comprises a projection lens device positioned between the sample and the first shearing device for focusing the transmitted electron pulse onto the detector.

In one embodiment, the second direction is opposite to the first direction.

According to still another broad aspect, there is provided a transmission electron microscopy method for imaging a sample, comprising: generating an initial electron pulse and propagating the initial electron pulse through the sample, thereby obtaining a transmitted electron pulse; temporally shearing the transmitted electron pulse in a first direction, thereby obtaining a sheared electron pulse; encoding the sheared electron pulse according to a predefined pattern, thereby obtaining an encoded electron pulse; temporally shearing the encoded electron pulse in a second direction different from the first direction, thereby obtaining a processed electron pulse; detecting the processed electron pulse, thereby obtaining a single image of the sample; determining a spatiotemporal datacube from the single image using the predefined pattern; and outputting the spatiotemporal datacube.

In one embodiment, the step of generating the initial electron pulse comprises: generating an optical pulse; and propagating the optical pulse towards a photocathode, thereby generating the initial electron pulse.

In one embodiment, the step of encoding the transmitted electron pulse comprises propagating the transmitted electron pulse through a mask having the predefined pattern.

In one embodiment, the step of temporally shearing the transmitted electron pulse comprises applying a first time-varying shear force on electrons contained in the transmitted electron pulse by applying a first time-varying voltage to a first pair of electrodes.

In one embodiment, the step of temporally shearing the encoded electron pulse comprises applying a second time-varying shear force on electrons contained in the encoded electron pulse by applying a second time-varying voltage to a second pair of electrodes.

In one embodiment, the step of said detecting the processed electron pulse is performed using a charge-coupled device configured for generating the single image of the sample via spatiotemporal integration.

In one embodiment, the transmission electron microscopy method further comprises focusing the initial electron pulse onto the sample.

In one embodiment, the transmission electron microscopy method further comprises focusing the transmitted electron pulse onto the detector.

In one embodiment, the second direction is opposite to the first direction.

According to a further broad aspect, there is provided a transmission electron microscopy system for imaging a sample, comprising: a pulse generator for generating an initial electron pulse towards the sample, the initial electron pulse to be propagated through the sample to obtain a transmitted electron pulse; an encoding device for encoding the transmitted electron pulse according to a predefined pattern to obtain an encoded electron pulse; a shearing device for temporally shearing the encoded electron pulse in a given direction to obtain a given electron pulse; a detector for detecting the given electron pulse to obtain a single image of the sample; and a datacube generator for determining a spatiotemporal datacube from the single image using the predefined pattern, and outputting the spatiotemporal datacube.

In one embodiment, the pulse generator comprises a photocathode and a pulsed light source for generating an optical pulse towards the photocathode to generate the initial electron pulse.

In one embodiment, the encoding device comprises a mask having the predefined pattern.

In one embodiment, the mask is made of a material opaque to electrons and comprises holes therethrough to form the predefined pattern.

In one embodiment, the shearing device comprises a pair of electrodes connectable to a source of electrical power and configured for applying a time-varying shearing force on electrons contained in the encoded electron pulse.

In one embodiment, the detector comprises charge-coupled device detector for generating the single image of the sample via spatiotemporal integration.

In one embodiment, the transmission electron microscopy system further comprises a condenser lens device positioned between the pulse generator and the sample for focusing the initial electron pulse onto the sample.

In one embodiment, the transmission electron microscopy system further comprises a projection lens device positioned between the sample and the encoding device for focusing the transmitted electron pulse onto the detector.

In one embodiment, the transmission electron microscopy system further comprises a shearing unit positioned between the sample and the encoding device, the shearing unit for temporally shearing the transmitted electron pulse in a further direction to obtain a further electron pulse to be propagated up to the encoding device, the further direction being different from the given direction.

In one embodiment, the further direction is opposite to the given direction.

According to still a further broad aspect, there is provided a transmission electron microscopy method for imaging a sample, comprising: generating an initial electron pulse and propagating the initial electron pulse through the sample, thereby obtaining a transmitted electron pulse; encoding the transmitted electron pulse according to a predefined pattern, thereby obtaining an encoded electron pulse; temporally shearing the encoded electron pulse in a given direction, thereby obtaining a given electron pulse; detecting the given electron pulse, thereby obtaining a single image of the sample; determining a spatiotemporal datacube from the single image using the predefined pattern; and outputting the spatiotemporal datacube.

In one embodiment, the step of generating the initial electron pulse comprises: generating an optical pulse; and propagating the optical pulse towards a photocathode, thereby generating the initial electron pulse.

In one embodiment, the step of encoding the transmitted electron pulse comprises propagating the transmitted electron pulse through a mask having the predefined pattern.

In one embodiment, the mask is made of a material opaque to electrons and comprises holes therethrough to form the predefined pattern.

In one embodiment, the step of temporally shearing the encoded electron pulse comprises applying a time-varying shear force on electrons contained in the encoded electron pulse by applying a time-varying voltage to a pair of electrodes.

In one embodiment, the step of detecting the sheared electron pulse is performed using a charge-coupled device configured for generating the single image of the sample via spatiotemporal integration.

In one embodiment, the transmission electron microscopy method further comprises focusing the initial electron pulse onto the sample.

In one embodiment, the transmission electron microscopy method further comprises focusing the transmitted electron pulse onto the detector.

In one embodiment, the transmission electron microscopy method further comprises temporally shearing the transmitted electron pulse in a further direction prior to said encoding, thereby obtaining a given electron pulse, said encoding comprising encoding the given electron pulse and the further direction being different from the given direction.

In one embodiment, the further direction is opposite to the given direction.

BRIEF DESCRIPTION OF THE DRAWINGS

Further features and advantages of the present invention will become apparent from the following detailed description, taken in combination with the appended drawings, in which.

It will be noted that throughout the appended drawings, like features are identified by like reference numerals.

DETAILED DESCRIPTION

In the following, there are described methodologies that combine the electron-photon spatiotemporal imaging methods with computational image reconstruction algorithms based on compressed sensing (CS). Each methodology may be embodied as a method and a system, as described below.

Figure 1:
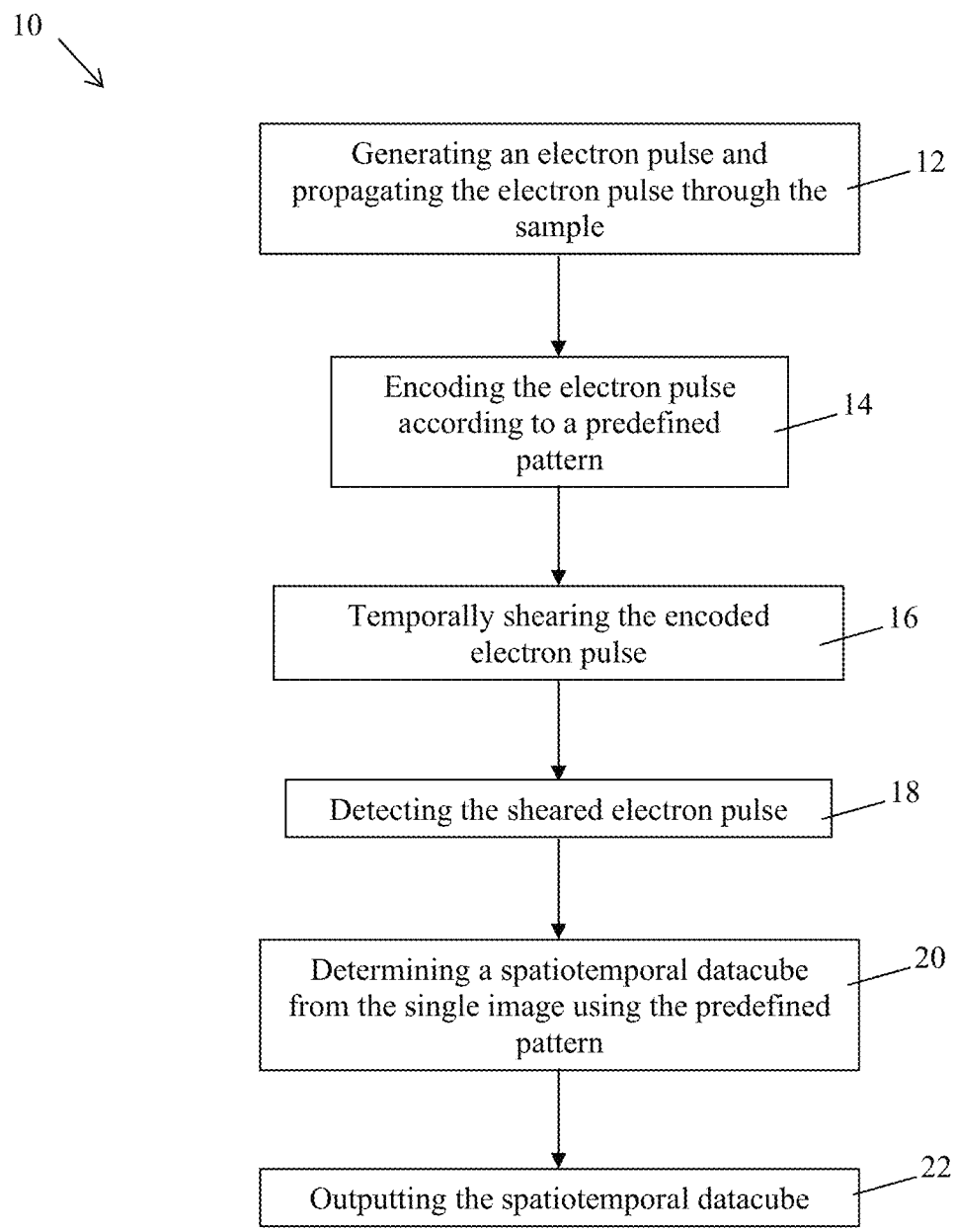
FIG. 1 is a flow chart of a transmission electron microscopy method for generating an image of a sample, the method comprising a single electron pulse shearing step, in accordance with an embodiment.

FIG. 1 illustrates one embodiment of a first method 10 for imaging a sample. It should be understood that the sample may be any sample that can be imaged by conventional TEM. For example, the sample may include the intensity of the dipole of silver nanoparticles, moving nanoscale cantilevers, etc.

At step 12, an initial electron pulse is generated using any adequate electron pulse generator. It should be understood that any adequate electron pulse generator may be used for generating the initial electron pulse. For example, a light source such as a pulsed laser may be combined with a photocathode to generate the initial electron pulse, as known in the art. In this case, an optical pulse is generated by the pulsed laser. The optical pulse propagates up to the photocathode and excites the photocathode which in turn emits an electron pulse, i.e. the initial electron pulse.

The person skilled in the art will understand that the energy of the initial electron pulse should be chosen so that the electron pulse be detectable once reaching the pulse detector. In one embodiment, the initial pulse may contain 10-100 million electrons with a temporal width in the order of nano-seconds.

The initial electron pulse is further propagated up to the sample at step 12. After reaching the sample, the initial electron pulse propagates through the sample.

After propagating through the sample, the electron pulse is encoded at step 14. The encoding of the electron pulse consists in spatially changing the amplitude of the electron pulse in a predefined manner.

In one embodiment, the step of encoding the electron pulse is performed by propagating the electron pulse through a mask defining a predefined pattern. The mask comprises first sections that at least partially block the propagation of electrons and second sections that allow electrons propagating therethrough. The first and second sections are located within the mask according to the predefined pattern. For example, the mask may be made of a material that at least partially blocks the propagation of electrons and the second sections of the mask may correspond to holes extending through the entire thickness of the mask. It should be understood that any adequate pattern may be used. For example, the first and second sections forming the pattern may have a square shape, a rectangular shape, etc. The size of the first and second sections may be constant throughout the first sections and/or the second sections. For example, the pattern of the mask may have a chessboard shape.

It should be understood that the mask may be made of any material being opaque to electrons. For example, the mask may be made of metal such as copper or aluminum. In this case, the second sections that allow electrons propagating therethrough correspond to holes in the mask.

In one embodiment, the encoding of the electron pulse may vary in time so that the encoding of the front/leading edge of the electron pulse be different from the encoding of the back/trailing edge of the electron pulse. In another embodiment, the encoding of the electron pulse may be constant in time.

In one embodiment, the predefined pattern of the mask is randomly chosen, i.e. the number, position, size and/or shape of the first and second sections within the mask may be randomly chosen.

Once encoded, the electron pulse is temporally sheared at step 16. An electromagnetic field is generated and the electron pulse propagates through the generated electromagnetic field. The electromagnetic field (such as the amplitude of the electromagnetic field) varies in time so that the shearing force applied to the electrons of the pulse varies in time. As a result of the shearing force applied to the electron pulse, the electrons are spatially staggered and the spatial offset of the electrons varies in time.

In one embodiment, the shearing of the electron pulse is performed substantially orthogonally to the propagation direction of the electron pulse. As a result, a shearing force is applied to the electrons contained in the electron pulse according to a shearing direction that is substantially orthogonal to the propagation direction of the electron pulse. Due to the shearing force, the electrons spatially move within a plane substantially orthogonal to the propagation direction of the electron pulse in the shearing direction.

In one embodiment, the amplitude of the shearing electromagnetic field increases in time while the electron pulse propagates therethrough so that the shearing force applied to the electrons located at the front/leading edge of the electron pulse be less than that applied to the electrons located at the back/trailing edge of the electron pulse. Under the effect of the shearing force, the electrons moves transversely to the propagation direction of the electron pulse by a given distance. Since the shearing force increases in time during the propagation of the electron pulse due to the amplitude-increasing shearing electromagnetic field, the electrons located at the front edge of the electron pulse transversely move by a first distance while the electrons located at the back edge of the electron pulse will transversely move by a second distance that is greater than the first distance.

In one embodiment, the increase in the amplitude of the electromagnetic field, and therefore the increase in the amplitude of the shearing force, is linear during the propagation of the electron pulse within the electromagnetic pulse. As a result, the distance by which the electrons move transversely also increases linearly in time from the front edge of the electron pulse to the back edge of the electron pulse.

It should be understood that any adequate device or system for generating the electromagnetic field and therefore the shearing force may be used. For example, a pair of electrodes may be used for generating the electromagnetic field. In another example, the shearing force may be generated by creating a time-varying magnetic field via Lorentz force.

At step 18, the sheared electron pulse is detected so that a single image of the electron pulse be generated. Each point of the image corresponds to a given point on the detector used to detect the sheared electron pulse. An amplitude value is associated with each point of the image and the amplitude associated with a given point of the image corresponds to the summation of the energy amplitudes of the electrons that hit the point of the detector that corresponds to the point of the image during the duration of the electron pulse.

It should be understood that any detector adequate for detecting an electron pulse and generating an image of the electron pulse may be used. For example, a charge-coupled device (CCD) camera may be used for imaging the electron pulse.

At step 20, a spatiotemporal datacube is generated from the single image of pulse generated at step 18 using the predefined pattern, as described below. A datacube should be understood as being a three-dimensional matrix that contains information from two-dimensional space and time. In the present case, a spatiotemporal datacube represents the spatiotemporally varying density of the electron pulse transmitted through the sample.

Finally, the datacube is outputted at step 22. For example, the datacube may be stored into memory. In the same or another example, the datacube may be transmitted to a computer.

In one embodiment, a 3D visual representation of the datacube may be generated and stored in memory. In the same or another embodiment, the visual representation of the datacube may be displayed on a display unit.

In one embodiment, the method 10 further comprises steps of converging the initial electron pulse and magnifying the converged electron pulse before propagating the electron pulse on the sample. For example, the initial electron pulse may be propagated through a converging electromagnetic lens or a system of converging electromagnetic lenses for converging the initial electron pulse, and the converged electron pulse may be propagated through a projection electromagnetic lens or a system of projection electromagnetic lenses in order to expand the electron pulse before it reaches the sample.

Figure 2:
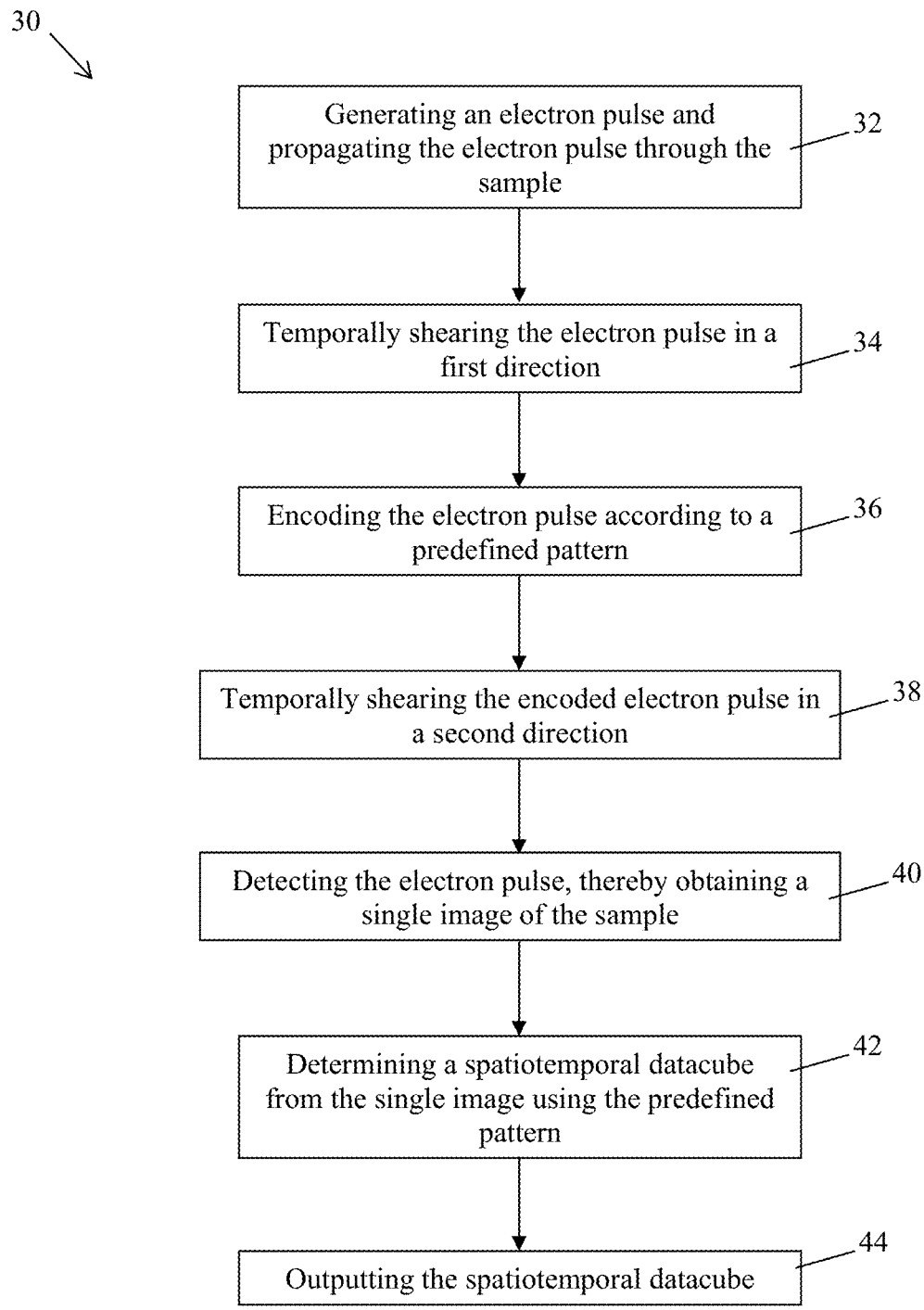
FIG. 2 is a flow chart of a transmission electron microscopy method for generating an image of a sample, the method comprising two electron pulse shearing steps, in accordance with an embodiment.

FIG. 2 illustrates a further method 30 for generating an image of an electron pulse. While the method 10 comprises a single step of shearing an electron pulse used to image a sample, the method 30 comprises two shearing steps as described below.

Like step 12, a pulse of electrons is generated at step 32. It should be understood that any adequate method and system can be used for generating the electron pulse.

At step 34, the generated electron pulse is temporally sheared in a first spatial direction. An electromagnetic field is generated and the electron pulse is propagated though the electromagnetic field. Like step 16, it should be understood that any adequate method or system for temporally shearing an electron pulse may be used. For example, a pair of electrodes may be used for generating the electromagnetic field.

As described above, the electromagnetic field and therefore the shearing of the electron pulse vary in time so that the shearing force applied to the front edge of the electron pulse is different from the shearing force applied to the back edge of the electron pulse. During the propagation of the electron pulse though the electromagnetic field, the direction of the shearing force remains constant.

In one embodiment, the shearing force applied to the electron pulse increases in time during the propagation of the electron pulse through the electromagnetic field. In one embodiment, the increase of the shearing force is linear during the propagation of the electron pulse through the electromagnetic field.

After being temporally sheared according to a first spatial direction, the sheared electron pulse is encoded at step 36.

In one embodiment, the encoding of the sheared electron pulse is performed by propagating the sheared electron pulse through a mask having a predefined pattern, as described above with respect to step 14. It should be understood that the size of the mask is adequate for encoding the whole sheared electron pulse.

After being encoded, the electron pulse is temporally sheared a second time but in a second spatial direction, at step 38. The encoded electron pulse is propagated through a second electromagnetic field that generates a second shearing force on the electrons of the electron pulse. The second spatial direction is different from the first spatial direction. As with the first shearing force applied at step 34, the amplitude of the second shearing force applied at step 38 varies in time during the propagation of the electron pulse through the electromagnetic field.

In one embodiment, the second spatial direction is opposite to the first spatial direction.

In one embodiment, the second shearing force applied at step 38 is the opposite to the first shearing force applied at step 34, i.e. the second spatial direction is opposite to the first spatial direction and the amplitude in time of the second shearing force generated at step 38 is substantially identical to the amplitude in time of the first shearing force generated at step 34. In this case, the second shearing force compensates for the offset generated on the electrons by the first shearing force.

After the second shearing step, the electron pulse is detected at step 40 and a single image of the electron pulse is generated. It should be understood that any adequate method or system for detecting and generating a single image of an electron pulse may be used at step 40. For example, a CCD camera may be used.

At step 42, a spatiotemporal datacube is generated from the single image of the electron pulse obtained at step 40 using the predefined pattern used for encoding the electron pulse, as described below.

Finally, the datacube is outputted at step 44. For example, the datacube may be stored into memory. In the same or another example, the datacube may be transmitted to a computer.

In one embodiment, a 3D visual representation of the datacube may be generated and stored in memory. In the same or another embodiment, the visual representation of the datacube may be displayed on a display.

In one embodiment, the method 50 further comprises steps of converging the initial electron pulse and magnifying the converged electron pulse before propagating the electron pulse on the sample. For example, the initial electron pulse may be propagated through a converging electromagnetic lens or a system of converging electromagnetic lenses for converging the initial electron pulse and the converged electron pulse may be propagated through a projection electromagnetic lens or a system of projection electromagnetic lenses in order to expand the electron pulse before it reaches the sample.

Figure 3A:
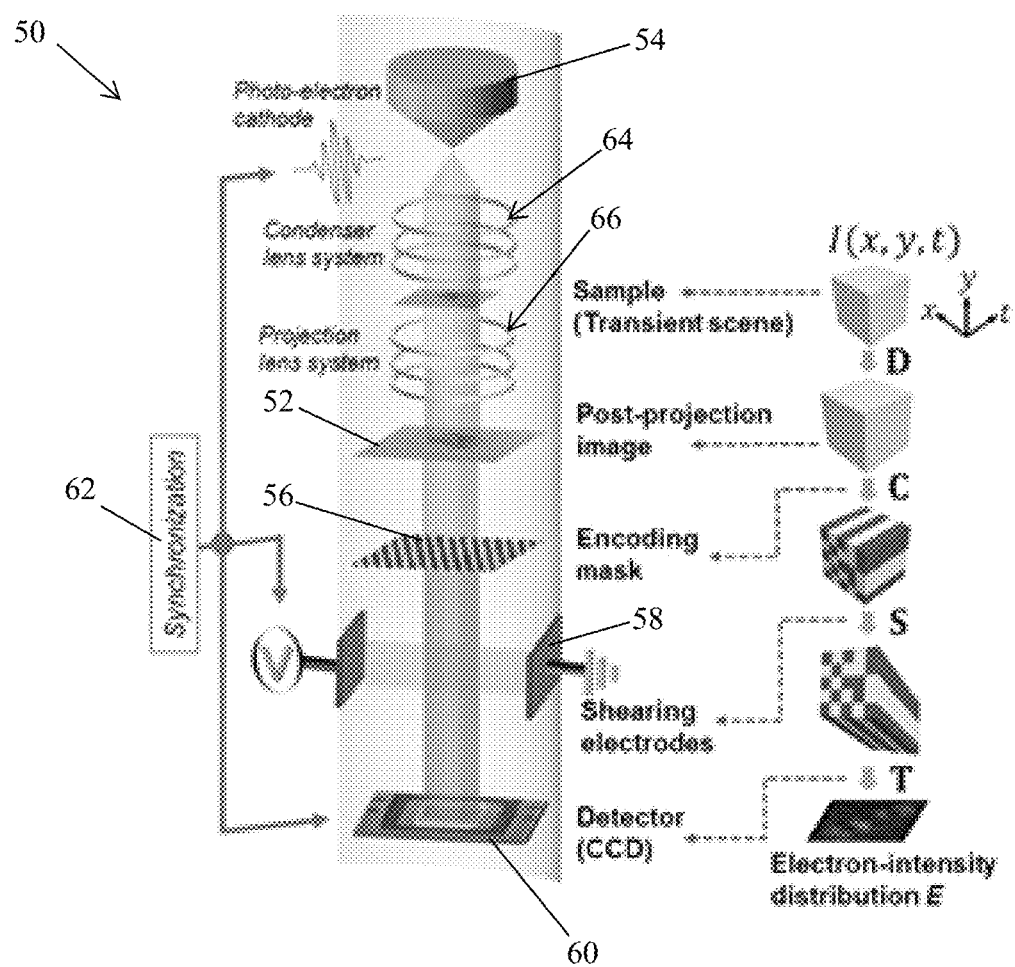
FIG. 3A illustrates a transmission electron microscopy system comprising an electron pulse generator, a spatial encoding mask; a temporal shearing force generator and a pulse detector, in accordance with an embodiment.

Referring to FIG. 3A, there is illustrated one embodiment of a system 50 for imaging a sample 52. The system 50 may be used for executing the above-described method 10.

The system 50 comprises a generator 54 of electron pulses, a pulse encoder 56, a shearing force generator 58, a pulse detector 60, a controller 62 and an image or image reconstruction generator (not shown). In the illustrated embodiment, the electron pulse generator 54 comprises a photocathode, the pulse encoder 56 comprises a mask having a predefined pattern, the shearing force generator 58 comprises a pair of electrodes and the pulse detector 60 comprises a CCD camera. However, as described above, it should be understood that at least some other components may be used as long as their intended functionality is achieved.

The generator 54 is configured for generating a pulse of electrons which propagates up to the sample 52. After propagating through the sample 52, the electron pulse reaches the pulse encoder 56 where the electron pulse is encoded. The encoded pulse then propagates up to the shearing force generator 58 where a shearing force is applied to the electrons of the pulse while it propagates therethrough. As described above, the amplitude of the shearing force varies in time while the encoded electron pulse propagates through the shearing force generator 58 to obtain a sheared electron pulse.

The sheared electron pulse is then detected by the pulse detector 60 and a single image of the sheared electron pulse is generated. The image represents the energy amplitude detected for each spatial point of the electron pulse during the duration of the electron pulse. The image of the electron pulse is transmitted to the image generator which reconstructs a datacube from the image of the electron pulse generated by the pulse detector 60 using the predefined encoding pattern, as described in more detail below.

In one embodiment such as in the illustrated embodiment, the system 50 further comprises a system of converging electromagnetic lenses 64 for converging the initial electron pulse generated by the generator 54, and a system of projection electromagnetic lenses 56 for magnifying the converged electron pulse. The system of converging electromagnetic lenses 64 is positioned between the generator 54 and the sample 52 and the system of projection electromagnetic lenses 56 is positioned between the system of converging electromagnetic lenses 64 and the sample 52.

It should be understood that the controller 62 is configured for timely synchronizing the operation of the generator 54, the shearing force generator 58 and optionally the pulse detector 60. The controller 62 synchronizes the emission of the electron pulse by the pulse generator 54, the application of the shearing force to the electron pulse so that the shearing force be applied when the electron pulse propagates through the shearing force generator 58, and optionally the detection of the electron pulse so that the pulse detector 60 be only activated during the reception of the electron pulse. The controller 62 further controls the amplitude in time of the shearing force applied to the electrons by the shearing force generator 58. For example, when the shearing force generator 58 comprises a pair of electrodes connected to a power source, the controller 62 may control the voltage in time applied to the pair of electrodes to as to apply a desired shearing force on the electrons of the electron pulse.

In one embodiment, the system 50 is a retrofitted TEM system. The original system comprises the generator 54, the detector 60 and optionally the system of converging electromagnetic lenses 64 and the system of projection electromagnetic lenses 56. The pulse encoder 56 and the shearing force generator 58 are then added to the original system.

Figure 3B:
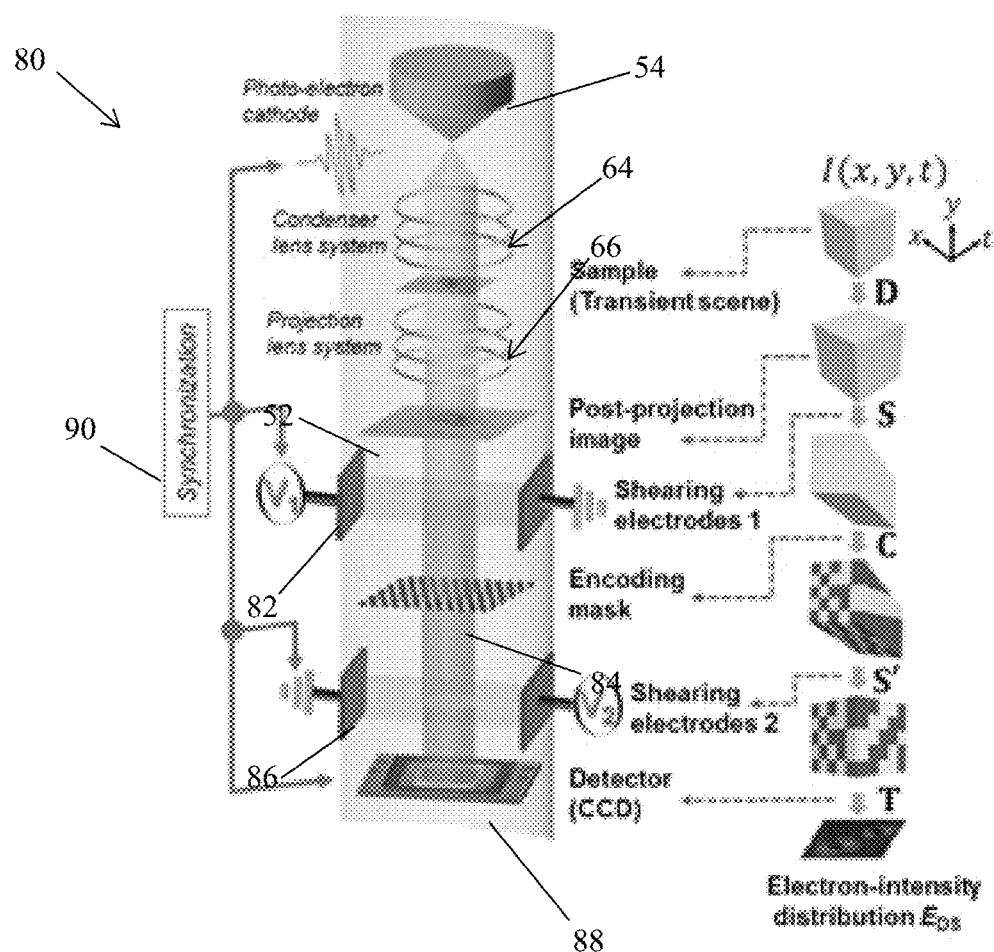
FIG. 3B illustrates a transmission electron microscopy system comprising an electron pulse generator, a first temporal shearing force generator, a spatial encoder; an inverse temporal shearing force generator and a pulse detector, in accordance with an embodiment.

FIG. 3B illustrates one embodiment of a system 80 for generating an image of a sample 52. The system 50 may be used for executing the above-described method 30.

The system 80 comprises a generator 54 of electron pulses, a first shearing force generator 82, a pulse encoder 84, a second force shearing generator 86, a pulse detector 88, a controller 90 and an image generator (not shown). In the illustrated embodiment, the electron pulse generator 54 comprises a photocathode, the first shearing force generator 82 comprises a first pair of electrodes, the pulse encoder 84 comprises a mask having a predefined pattern, the second shearing force generator 86 comprises a second pair of electrodes and the pulse detector 88 comprises a CCD camera.

The generator 54 is configured for generating a pulse of electrons which propagates up to the sample 52. After propagating through the sample 52, the electron pulse reaches the first shearing force generator 82 where a first shearing force is applied to the electron pulse propagating from the sample 52. The temporal shearing is performed according to a first spatial direction. The sheared electron pulse propagates up to the pulse encoder 84 where it is encoded, as described above. The encoded pulse then propagates up to the second shearing force generator 86 where a second shearing force is temporally applied to the electrons of the pulse while it propagates therethrough. The second force is applied in a direction differnet from the direction of the first shearing force. In one embodiment, the second direction is opposite to the first direction. In one embodiment, the second shearing force is the opposite of the first shearing force, i.e. the second direction is opposite to the first direction and the amplitude in time of the second shearing force is substantially equal to the amplitude in time of the first shearing force. As described above, the amplitude of the first and second shearing forces varies in time while the electron pulse propagates through the shearing force generators 86 and 86.

The sheared electron pulse propagating from the second shearing force generator 86 is then detected by the pulse detector 88 and a single image of the electron pulse is generated. The image represents the energy amplitude detected for each spatial point of the electron pulse during the duration of the electron pulse. The image of the electron pulse is transmitted to the image generator which reconstructs a data cube from the image of the electron pulse generated by the pulse detector 88 using the predefined encoding pattern applied by the pulse encoder 84, as described in more detail below.

In one embodiment, the system 80 further comprises a system of converging electromagnetic lenses 64 for converging the initial electron pulse generated by the generator 54, and a system of projection electromagnetic lenses 56 for magnifying the converged electron pulse. The system of converging electromagnetic lenses 64 is positioned between the generator 54 and the sample 52 and the system of projection electromagnetic lenses 56 is positioned between the system of converging electromagnetic lenses 64 and the sample 52.

It should be understood that the controller 90 is configured for synchronizing the operation of the generator 54, the shearing force generators 82 and 86 and optionally the pulse detector 88. The controller 90 synchronizes the emission of the electron pulse by the pulse generator 54, the application of the first shearing force to the electron pulse so that the first shearing force be applied when the electron pulse propagates through the first shearing force generator 82, the application of the second shearing force to the electron pulse so that the second shearing force be applied when the electron pulse propagates through the second shearing force generator 86, and optionally the detection of the electron pulse so that the pulse detector 88 be only activated during the reception of the electron pulse. The controller 90 further controls the amplitude of the shearing forces applied to the electrons by the shearing force generators 82 and 86. For example, when the shearing force generator 82, 86 comprises a pair of electrodes connected to a power source, the controller 88 may control the voltage applied to the pair of electrodes to as to apply a desired shearing force on the electrons of the electron pulse.

In the following, there is described two exemplary single-shot real-time ultrafast electron imaging configurations, synergizing CUP and laser-assisted TEM. The first configuration, hereinafter referred to as compressed ultrafast TEM (CUTEM), can be integrated into an existing laser-assisted TEM system without excessive modifications. The second configuration, hereinafter referred to as dual-shearing (DS)-CUTEM, can offer improved imaging quality, but with more elaborate modifications to the hardware. The (DS)-CUTEM technique also allows the use of a smaller pulse detector in comparison to the CUTEM technique. For each configuration, it is examined how each manipulation of a transient scene during electron propagation and data acquisition affected reconstructed image quality by using experimental data as the ground truth. These quantitative analyses allow for the optimization of the reconstructed imaging quality. As a result, it was possible to use the proposed configurations to reconstruct spatiotemporal datacubes, which were found to be in good agreement with the ground truth. This study verifies the feasibility of implementing CS-aided ultrafast imaging modalities to TEM. The proposed schemes have potential to achieve single-shot ultrafast imaging in real time with sub-nanosecond temporal resolution and nanometers real-space resolution.

The rest of the present description is organized as follows. In Section 1, the system designs with the analytical models of associated data acquisition and imaging reconstruction is presented. In Section 2, the optimization of reconstructed image quality and proof-of-concept demonstrations using numerical simulation are described. In Section 3, it is discussed how the proposed techniques could guide the future experiments.

1. Method

1.1 CUTEM

The proposed CUTEM technique illustrated in FIG. 3a may be experimentally realized by integrating a mask and shearing electrodes to a laser-assisted TEM machine. In CUTEM, a single nanosecond electron pulse probes a transient event initiated in a sample to generate a spatiotemporally modulated electron density function, I(x,y,t). The transmitted electron pulse, then, experiences several manipulations, each of which is accounted by an operator (detailed in the following paragraph). Specifically, the pulse undergoes spatiotemporal electron distortion (due to the space-charge effect) during the ensuing propagation within the TEM system. A binary transmission mask, with a specifically designed pattern, is placed on the path of the imaging electrons to encode I(x,y,t). Produced by existing nanofabrication tools, this mask blocks the electrons at certain regions in space and allows them to pass through at others. Following the mask, a time-varying voltage, applied to a pair of electrodes, temporally shears I(x,y,t). Finally, a single streak image, denoted as E, is formed on a CCD camera via spatiotemporal integration (spatially integrating over each CCD pixel and temporally integrating over the exposure time). The mask and the shearing electrodes can be inserted to the TEM machine using one of the ports after the projection lens system.

Mathematically, the above-described data acquisition process can be expressed as a forward model [FIG. 3(*a*)] by $$E = TSCDI(x,y,t) \tag{1}$$

where the linear operator D represents electron's spatiotemporal distortion, C represents spatial encoding, S represents temporal shearing, and T represents spatiotemporal integration. For simplicity in denotation, a linear operator O is used to represent the entire data acquisition process (i.e., O=TSCD). After data acquisition, the transient scene computationally is retrieved. Given the known operator O and the spatiotemporal sparsity of the transient scene, I(x, y, t) can be recovered by solving the inverse problem of Eq. 1. This process can be formulated as $$\hat{I} = \underset{I}{\mathrm{argmin}} \|E - OI\|_2^2 + \lambda \Phi(I) \tag{2}$$

where is a weighting parameter, and $\Phi(\bullet)$ is the regularization function. In Eq. (2), the minimization of the first term, $\|E-OI\|_n^2$, occurs when the actual measurement E closely matches the estimated solution OI, while the minimization of the second term, $\Phi(I)$, encourages I to be piecewise constant (i.e., sparse in the spatial gradient domain). The weighting of these two terms is adjusted by $\lambda$ to lead to the results that are most consistent with the ground truth. Given the number of rows and columns of the CCD camera to be $N_r$ and $N_c$, the number of voxels in the reconstructed datacube (i.e., $N_x$, $N_y$, and $N_t$) must meet the requirement of $N_x \leq N_c$ and $N_y + N_t - 1 \leq N_r$.

2.2 Dual-Shearing (DS)-CUTEM

To increase the size of reconstructed datacube, there is described a variant referred to as dual shearing (DS)-CUTEM, whose system schematic is shown in FIG. 3B. The difference of DS-CUTEM with respect to CUTEM is that I(x, y, t) is sheared twice in opposite directions by two pairs of electrodes, which sandwich the spatial encoding mask. A similar voltage ramping waveform is used to control both pairs to avoid asymmetric shearing. The delay of shearing onsets is determined by the distance between these two deflectors and the electron pulse's propagation speed. The streak image recorded on the CCD camera is denoted as $E_{DS}$.

Mathematically, the forward model of DS-CUTEM can be expressed as $$E_{DS} = TS'CSDI(x,y,t), \tag{3}$$

where S' represents temporal shearing in a reverse direction to that of S. After data acquisition, DS-CUTEM uses the similar computational reconstruction method as CUTEM to retrieve the result, expressed by $$\hat{I} = \mathrm{argmin}_I \|E_{DS} - O'I\|_2^2 + \lambda \Phi(I), \tag{4}$$

where the linear operator O'=TS'CSD.

Compared with CUTEM, the dual-shearing operation implemented in DS-CUTEM allows the temporal course of a specific spatial position in the scene to be integrated at the same pixel of the CCD camera, circumventing the requirement of $N_y + N_t - 1 \leq N_r$ that is imposed by CUTEM. Consequently, each frame in the reconstructed datacube could have a maximum size of $N_x \times N_y = N_c \times N_r$, and $N_t$ would be limited by the dynamic range of the CCD camera. In addition, the dual-shearing operation implemented in DS-CUTEM enables designing a more incoherent measurement matrix. In particular, while encoded by the same mask in CUTEM, each frame in I(x, y, t) is imprinted by a different random binary mask in DS-CUTEM due to the first shearing operation prior to the spatial encoding. Consequently, DS-CUTEM has less mutual coherence between the measurement matrix and the sparsity basis of the transient scene than that of CUTEM, which yields an improved reconstructed image quality (detailed in Section 2).

1.3 Comparison of CUTEM and DS-CUTEM with Framing TEM

The proposed two configurations exceed the framing TEM (i.e. where the CCD camera is filled with spatially-separated frames) in temporal resolution and sequence depth. Both CUTEM and DS-CUTEM use spatial encoding and temporal shearing to tag each frame with a spatiotemporal "barcode". This prior information, along with the sparsity in the transient scene, allows spatiotemporal mixing of adjacent frames, which can be recovered in image reconstruction. The reconstructed frame rate, r, is thus determined by $$r=v/d, \tag{5}$$

where v is the temporal shearing velocity, and d is the CCD's pixel size along the temporal shearing direction. As a result, for a given recording time window, the proposed configurations can largely improve the temporal resolution, compared with the framing TEM. Spatiotemporal mixing also allows fitting more frames onto the CCD camera, which significantly increases the sequence depth.

2. Results

2.1 Simulation Setup

Figure 4A:
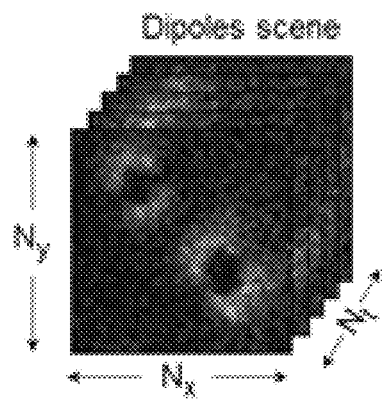
FIG. 4A illustrates an exemplary reconstructed dipole scene, in accordance with an embodiment.
Figure 4B:
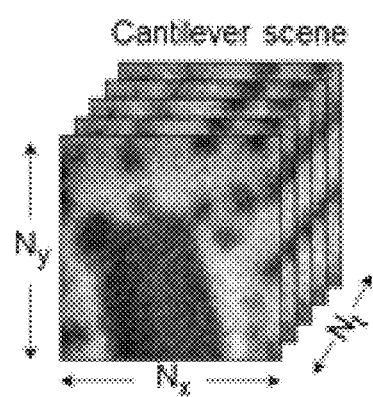
FIG. 4B illustrates an exemplary reconstructed cantilever scene, in accordance with an embodiment.

To test the proposed methods, two transient scenes were used. The first scene, shown in FIG. 4A, depicts near-field intensity dynamics of dipoles of two close-by silver nanoparticles excited by an ultrashort laser pulse (referred to hereafter as the 'dipole scene'). While holding fixed spatial positions, the dipoles have fluctuating intensities in time. Second, as shown in FIG. 4B a transient scene of a moving nanoscale cantilever was used (referred to as the 'cantilever scene' hereafter). Complementary to the dipole scene, the cantilever moves in space, while its intensity is almost constant. Both datasets are experimentally acquired and previously reported.

The general framework of our simulation is as follows. First, the sizes of both the dipole scene and cantilever scene were set to $N_x \times N_y \times N_t = 300 \times 300 \times 30$. Then, both scenes were used for the forward models of the two proposed methods [i.e., Eqs. (1) and (3)] to generate E and $E_{DS}$, respectively. To maximally mimic the experimental conditions, no noise filtering was conducted to any frames in either scenes. The sizes of E and $E_{DS}$ were $N_x \times N_{y,t} = 300 \times 329$ and $N_x \times N_{y,t} = 300 \times 300$, respectively. Here, $N_{y,t}$ represents the number of pixels in the axis where the spatial and temporal information are mixed. Finally, E and $E_{DS}$ were input into the two-step iterative shrinkage/thresholding (TwIST) algorithm to retrieve I(x, y, t) by solving Eqs. (2) and (4). Total variation (TV) was used as the regularization function. Compared with other regularization functions, such as $l_0$ or $l_1$ norms, TV regularization has superior performance in denoising while preserving important details in images.

2.2 Examination of Various Operators and Reconstructed Image Quality

Figure 4C:
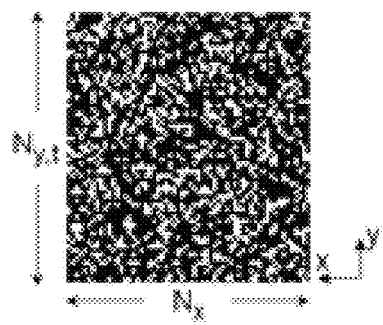
FIG. 4C illustrates an exemplary conventional binary mask, in accordance with an embodiment.
Figure 4D:
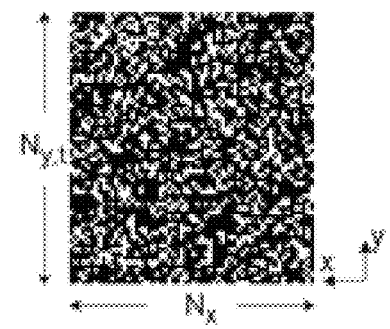
FIG. 4D illustrates an exemplary optimized binary mask, in accordance with an embodiment.

To investigate how each operator impacts the reconstructed image quality, different combinations of encoding masks, encoding pixel sizes, and SNRs were used in both proposed methods. First, the encoding mask provides the necessary prior information to extract the temporal information in image reconstruction. A pseudo-random binary mask, shown in FIG. 4C and referred to hereafter as the 'conventional mask' was implemented. This mask was constructed by binarizing a random matrix whose element values follow a Gaussian distribution. While incoherent with most sparse representation of the scene, the conventional mask might not be the optimal choice for a given sparse basis. To optimize the encoding mask, a column-normalized random matrix $\tilde{C}$ was used to generate its Gram matrix, defined by $\tilde{C}^T\tilde{C}$. When the Gram matrix approaches to a unit matrix H, the mutual coherence reaches the minimum. Mathematically, this optimization process can be formulated as $$\hat{C}=\operatorname{argmin}_{\tilde{C}}\|\tilde{C}^T\tilde{C}-H\|_F^2, \tag{6}$$

where $\|\cdot\|_F^2$ represents Frobenius norm. In practice, a gradient descent method was implemented to generate the optimized random binary mask, as shown in FIG. 4D. For simplicity, this mask is denoted as the "optimized mask".

Besides the mask pattern, the encoding pixel size was also optimized. On one hand, to satisfy the Nyquist sampling theory, the smallest feature in both spatial and temporal domains has to be sampled by at least two encoding pixels, meaning the smaller pixel size aides spatial and temporal resolutions. On the other hand, the smaller pixel size is more vulnerable to noise in the measurement and thus demands higher signal-to-noise ratios (SNRs) for transient scenes. Thus, the optimized encoding pixel size can be chosen by balancing the achievable resolution and noise.

Finally, the SNRs in E and $E_{DS}$, associated with the operator T [Eqs. (1) and (3)], were analyzed. Here, the SNR is defined as the quotient of the maximal intensity to the standard deviation of the noise in the acquired images (i.e., E and $E_{DS}$). To vary the SNR, zero-mean Gaussian noise with variances from 0 to 0.5 was added.

To quantitatively compare the reconstructed image quality, the structural similarity (SSIM) was used as the merit function. SSIM is a perception-based assessment model that considers image degradation as perceived change in structural information while also incorporating significant perceptual phenomena, including both luminance and contrast terms. Compared with conventional image quality assessment methods, such as mean squared error and peak signal-to-noise ratio, SSIM has a better capability to represent the perceived visual quality.

Figure 4E:
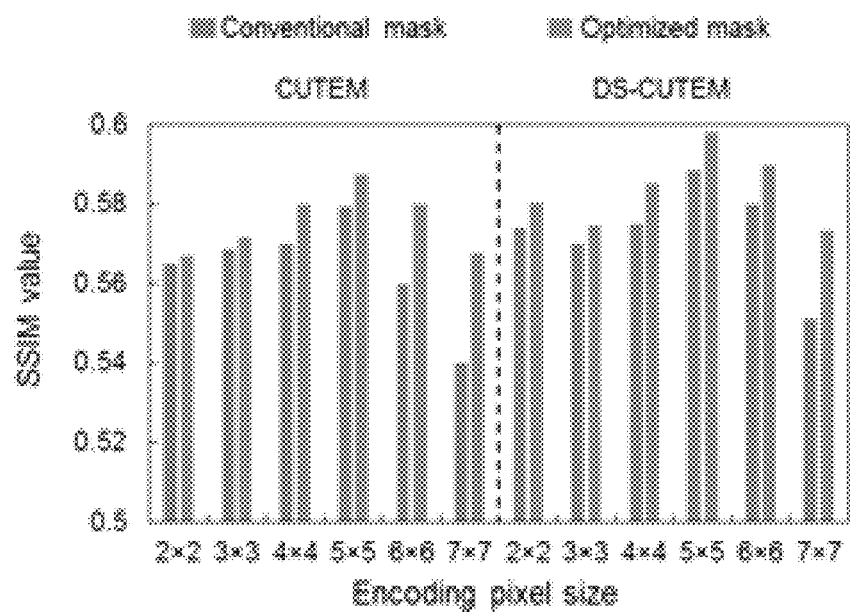
FIG. 4E illustrates exemplary SSIM values of the reconstructed dipole scene with different encoding pixel sizes for the conventional binary mask of FIG. 4C and the optimized binary mask of FIG. 4D for CUTEM and DS-CUTEM, in accordance with an embodiment.
Figure 4F:
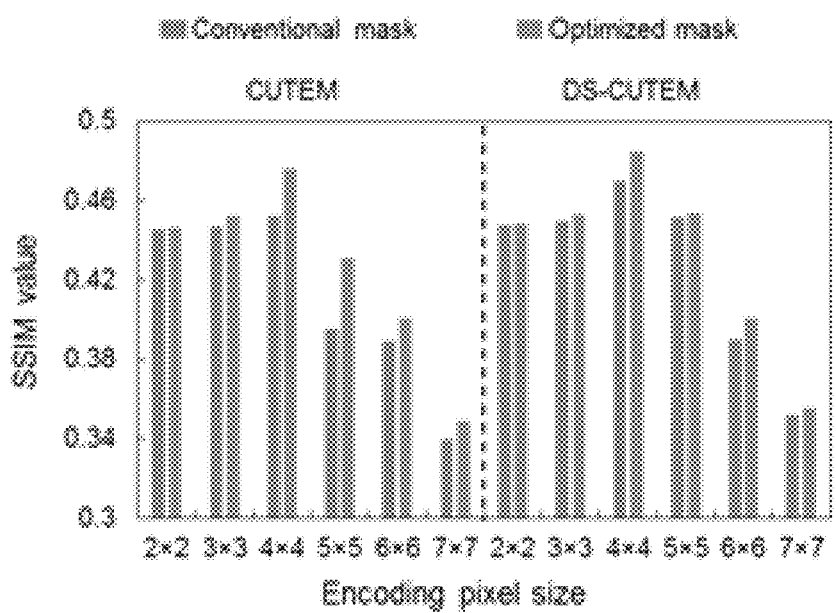
FIG. 4F illustrates exemplary SSIM values of the cantilever scene with respect to different encoding pixels sizes for the conventional binary mask of FIG. 4C and the optimized binary mask of FIG. 4D for CUTEM and DS-CUTEM, in accordance with an embodiment.

FIGS. 4E and 4F show SSIM values of the reconstructed dipole and cantilever scenes, using both the conventional and optimized encoding masks and with different encoding pixel sizes, for both CUTEM and DS-CUTEM. For both scenes, dual-shearing operation produces better reconstruction image quality than its single-shearing counterpart because of the more incoherent measurement matrix. FIGS. 4E and 4F also illustrate that mask optimization improves reconstructed image quality. Although the mask optimization was conducted only in the spatial domain, because C is a part of measurement matrix O and O', this operation still assisted in minimizing the mutual coherence between these measurement matrices and the sparsity basis, leading to a better reconstruction image quality. It is worth noting that although only demonstrated in the spatial domain in this work, mask optimization can be implemented for other sparsity bases, including discrete cosine transformation and discrete wavelet transformation. Finally, the optimal encoding pixel size was found to be 5×5 for the diploe scene and 4×4 for the cantilever scene, respectively. The varied optimal sizes are ascribed to the different imaging contents and characteristics in the two scenes.

Figure 4G:
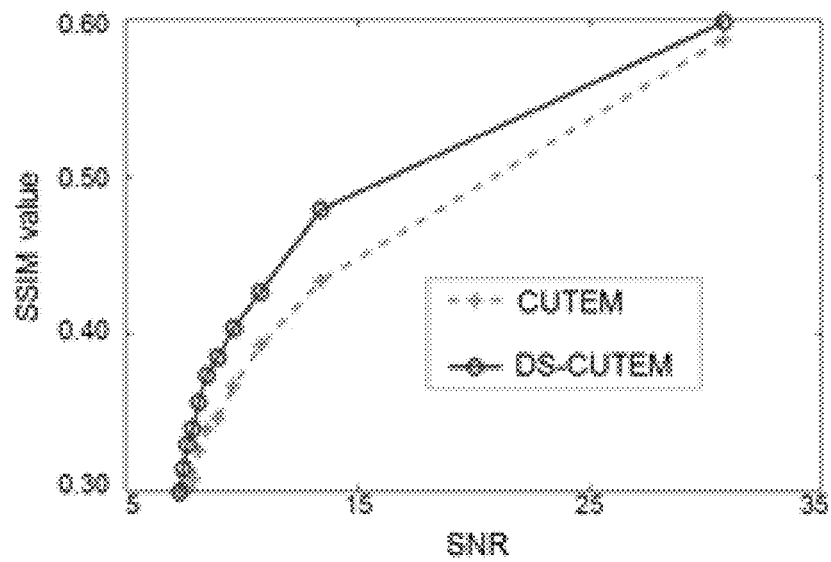
FIG. 4G illustrates exemplary SSIM values with respect to SNR for the dipole scene using a 5×5 encoding pixel size for CUTEM and DS-CUTEM, in accordance with an embodiment.
Figure 4H:
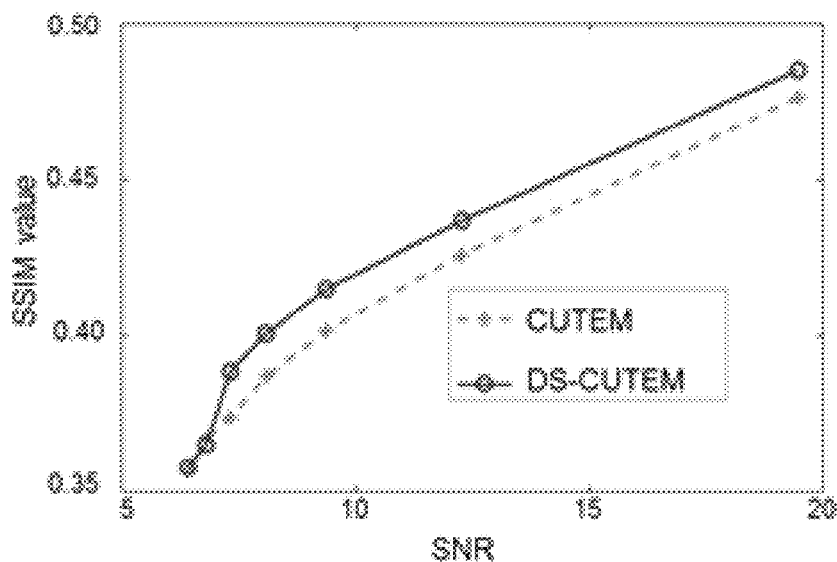
FIG. 4H illustrates exemplary SSIM values with respect to SNR for the cantilever scene using a 4×4 encoding pixel size for CUTEM and DS-CUTEM, in accordance with an embodiment.

FIGS. 4G and 4H present the changes in SSIM values of the dipole scene and the cantilever scene versus the SNRs of E and $E_{DS}$. The optimized encoding pattern and the optimized encoding pixel sizes were used for both scenes in this quantification. With decreasing SNRs, although the reconstructed image quality descends drastically for both proposed methods, DS-CUTEM performs consistently better than CUTEM until the SNR approaches five. There, the SSIM for both proposed methods converge and remain relatively unchanged for lower SNRs, because the noise has dominated the measurement results.

Figures 5A, 5B:
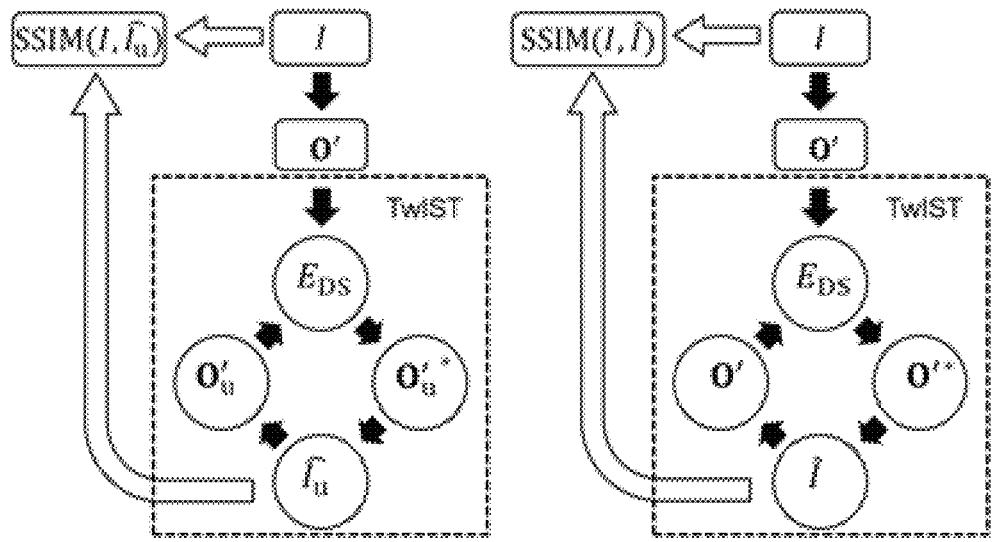
FIG. 5A illustrates a flowchart of reconstruction without distortion correction in DS-CUTEM, in accordance with an embodiment.
FIG. 5B illustrates a flowchart of reconstruction with distortion correction in DS-CUTEM, in accordance with an embodiment.

Besides the above-described optimization, for the influence of the space-charge effect on image distortion was accounted by introducing the operator D in Eqs. (1) and (3). Electrons' spatial and temporal expansion were modeled by a spatiotemporal Gaussian model. The expansion ratio in the model is defined as the quotient between the size of the distorted transient scene and that of the original one. A ratio smaller than one means spatial or temporal shrinkage. Both proposed methods were implemented to account for D and produced comparable results. For simplicity, only the results of DS-CUTEM are shown. The flow chart of the reconstruction process with electron distortion is shown in FIG. 5A. The transient scene first went through the operator O' to generate $E_{DS}$ (see Eq. 3). Then, $E_{DS}$ was used as an input into the TwIST algorithm to retrieve the estimated measurement $\hat{I}(x, y, t)$. The operator $O_u'$ represents TS'CS, and its inverse operator is represented as $O_u'^*$. Here, the subscript "u" stands for "uncorrected". Finally, the estimated measurement $\hat{I}(x, y, t)$ and input transient scene $I(x, y, t)$ were used to calculate the SSIM value. As a comparison, the flow chart of the reconstruction process with distortion correction is shown in FIG. 5B. O'* denotes the inverse operator of O'.

Figure 5C:
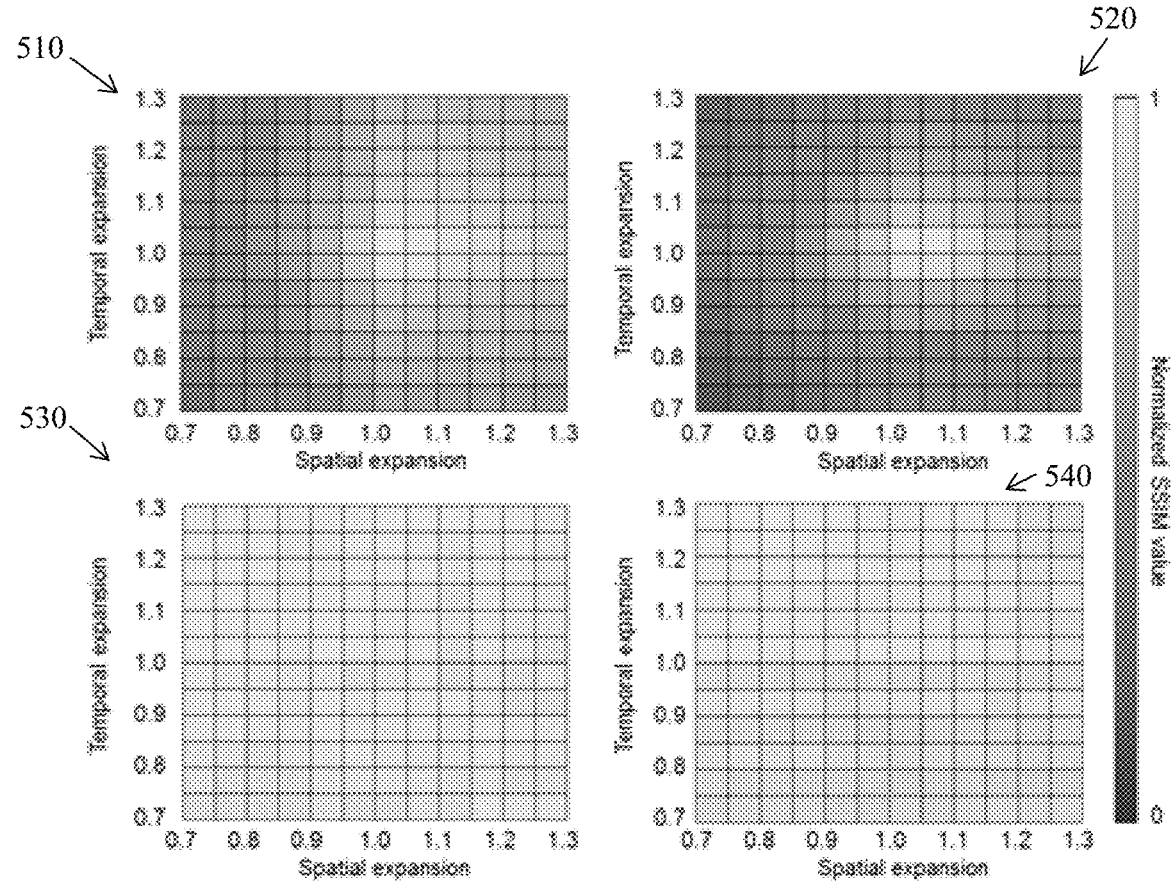
FIG. 5C illustrates exemplary normalized SSIM values of reconstructed datacubes of the dipole scene and the cantilever scene without distortion correction, and exemplary normalized SSIM values of reconstructed datacubes of the dipole scene and the cantilever scene with distortion correction, in accordance with an embodiment.

FIG. 5C shows the normalized SSIM values of the reconstructed dipole scene 510 with spatial and temporal expansions, both with ratios between 0.7 and 1.3. The expansions in both spatial and temporal domains deteriorated the reconstructed image quality, manifesting in the radially decreasing SSIM values from the origin (i.e., no spatial or temporal expansion). Similar degradation trend is observed for the cantilever scene 520. The result after correcting for electrons' spatiotemporal distortion through the operator D is shown for the reconstructed dipole scene 510 as the corrected reconstructed dipole scene 530 and for the reconstructed cantilever scene 530 as the corrected reconstructed cantilever scene 530. In both cases, corrections significantly alleviate the degradation, demonstrated as the high normalized SSIM values (between 0.95 and 0.96) across various spatiotemporal expansion.

In one embodiment, although a simple model was used for the operator D to compensate for the spatiotemporal distortions of the electron pulse, the reconstruction approach presented here is universal: as long as the operator D is known (e.g., obtained through a point-by-point calibration), image distortions due to electron repulsions can be accounted for. In a TEM system, the electron pulse can propagate a significant distance, with several crossovers in the imaging/projection lens system. For more precise reconstruction, these effects should be accounted for via elaborate studies of the electron trajectories. Nevertheless, for moderate electron densities in a pulse, a Gaussian model used here, as a first order approximation to model D, should be sufficient.

2.3 Feasibility Demonstration

Figure 6A:
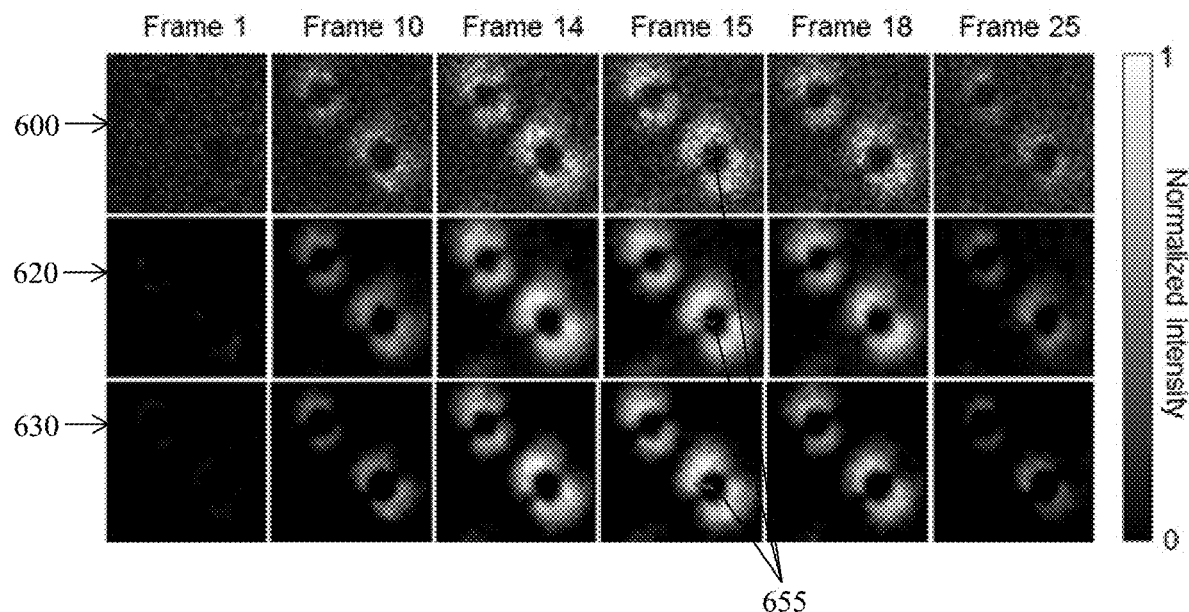
FIG. 6A illustrates exemplary representative frames of a dipole scene and corresponding reconstruction frames using CUTEM and DS-CUTEM, in accordance with an embodiment.
Figure 6B:
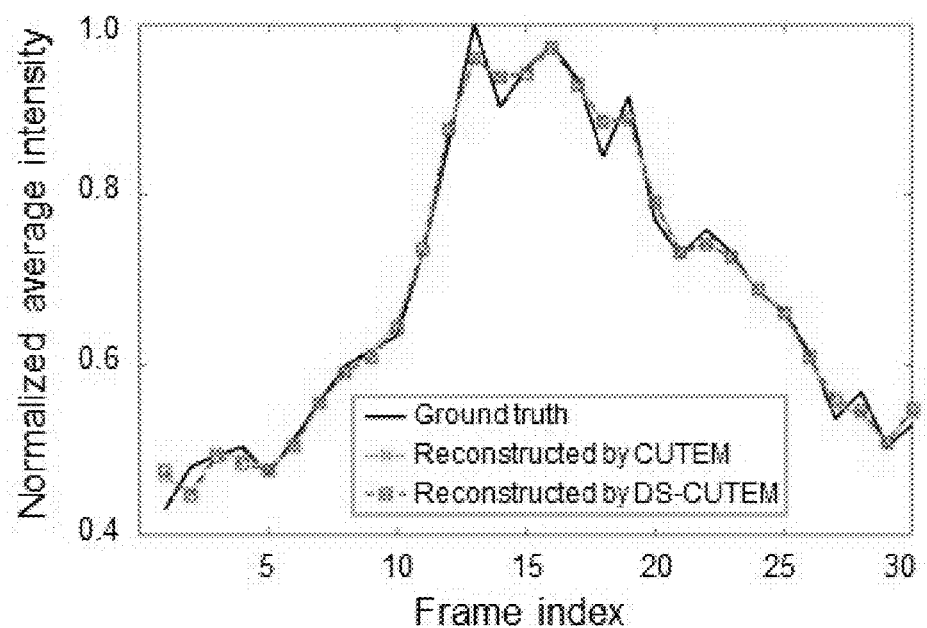
FIG. 6B illustrates an exemplary plot of normalized average intensity across all frames of the dipole scene and the reconstruction frames using CUTEM and DS-CUTEM, in accordance with an embodiment.
Figure 6C:
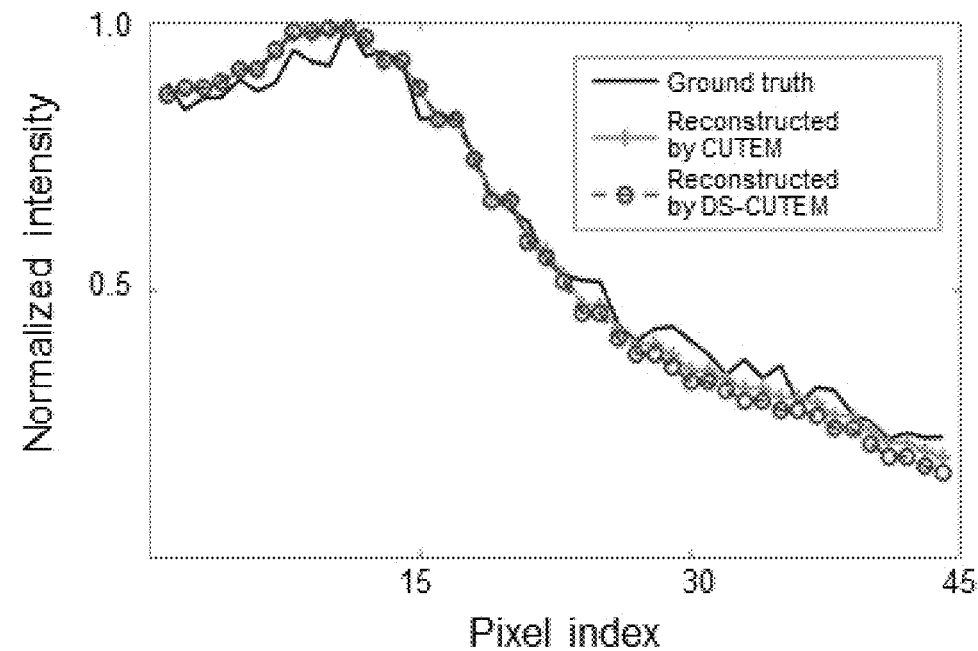
FIG. 6C illustrates a comparison of normalized intensity profiles of a spatial feature in frame 15 of FIG. 6A in the dipole scene and the reconstruction frames using CUTEM and DS-CUTEM, in accordance with an embodiment.

The methodology developed above was leveraged in reconstructing the two transient scenes. The represented frames of the dipole scene 600 (as the ground truth) are shown in FIG. 6A with the corresponding frames reconstructed by CUTEM 620 and the corresponding frames reconstructed by DS-CUTEM 630. A frame-to-frame comparison of the two reconstructed datacubes with the ground truth is shown in Media 1. Both CUTEM and DS-CUTEM significantly removed the noises presented in the dipole scene, demonstrated by a clean background in each reconstructed frame. FIG. 6B illustrates the change in normalized average intensity across all frames. The reconstruction results of CUTEM and DS-CUTEM are consistent with the ground truth. For a more detailed analysis, in FIG. 6C, the intensity profiles of a spatial feature 655 in Frame 15 of FIG. 6A in the ground truth and the reconstructed results are plotted. The reconstruction by both CUTEM and DS-CUTEM well complies with the ground truth.

Figure 7A:
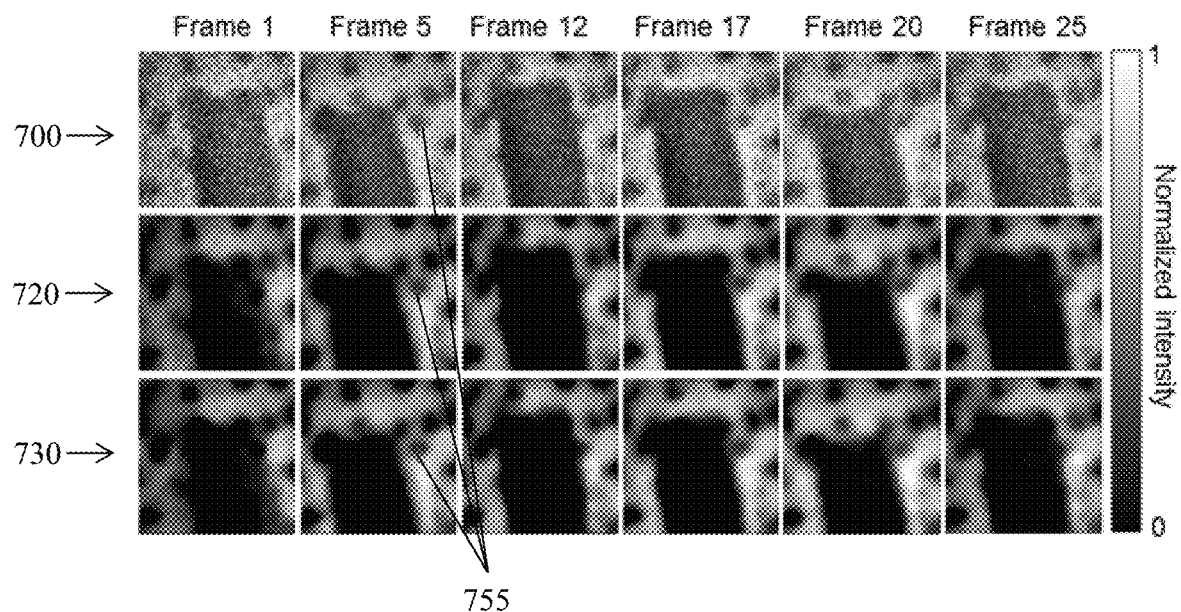
FIG. 7A illustrates exemplary representative frames of the cantilever scene and corresponding reconstruction frames using CUTEM and DS-CUTEM, in accordance with an embodiment.
Figure 7B:
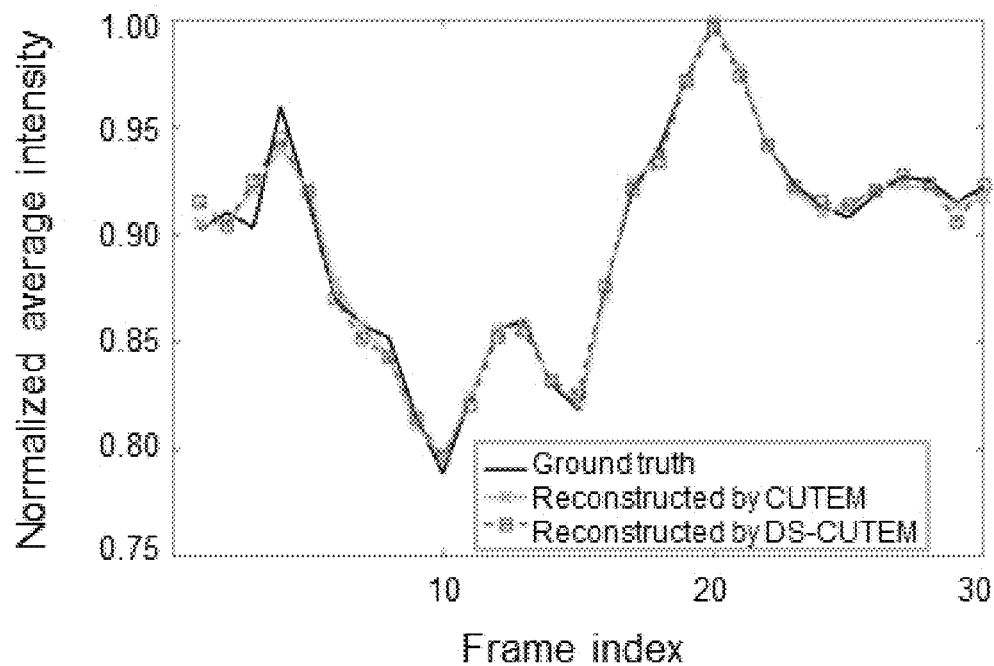
FIG. 7B illustrates an exemplary plot of the change in normalized average intensity across all frames of the cantilever scene and the reconstruction frames using CUTEM and DS-CUTEM, in accordance with an embodiment.
Figure 7C:
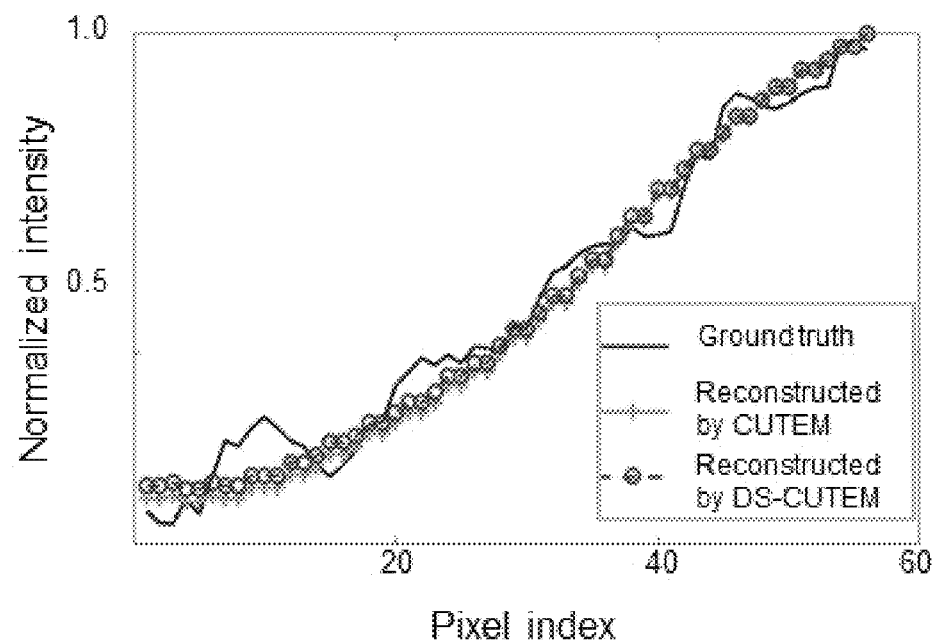
FIG. 7C illustrates a comparison of normalized intensity profiles of a spatial feature in frame 5 of FIG. 7A in the cantilever scene and the reconstruction frames using CUTEM and DS-CUTEM, in accordance with an embodiment.

Six representative frames of the cantilever scene 700 and its corresponding frames reconstructed by CUTEM 720 and its corresponding frames reconstructed by DS-CUTEM 730 are shown in FIG. 7A. The reconstructed movies are shown in Media 2. Similar to the dipole scene, the noise reduction is clearly represented in FIG. 7A, and the reconstruction is in good agreement with the ground truth, as shown in FIG. 7B. FIG. 7C shows the intensity profiles of a selected feature 755 in Frame 5 of FIG. 7A in the ground truth and reconstructed results, which again demonstrates the good agreement between the reconstructed results with the ground truth.

3. Discussion and Conclusions

The above analytical models and simulation have demonstrated that the single-shot ultrafast electronic imaging can be realized by integrating CS-aided ultrafast imaging modalities to laser-assisted TEM. In principle, through hardware modifications detailed in FIGS. 3A and 3B, it should be sufficient to record a single spatiotemporally modulated image in measurement and time-resolved frames through reconstruction.

In one embodiment, the beam currents in a conventional TEM system may hardly be sufficient to generate the image with high SNRs. Instead of continuous electron beams, pulsed beams can be utilized, where more than 10 million electrons can be packed in a nanosecond pulse. Such electron pulses can be generated using the photoelectric effect and powerful lasers. Temporal shearing and image recording needed for CUTEM and DS-CUTEM can be achieved with a nanosecond synchronization electronics.

The embodiments of the invention described above are intended to be exemplary only. The scope of the invention is therefore intended to be limited solely by the scope of the appended claims.

We claim:

1. A transmission electron microscopy system for imaging a sample, comprising:

a pulse generator for generating an initial electron pulse towards the sample, the initial electron pulse to be propagated through the sample to obtain a transmitted electron pulse;

an encoding device for encoding the transmitted electron pulse according to a predefined pattern to obtain an encoded electron pulse;

a shearing device for temporally shearing the encoded electron pulse in a given direction to obtain a given electron pulse;

a detector for detecting the given electron pulse to obtain a single image of the sample; and a datacube generator for determining a spatiotemporal datacube from the single image using the predefined pattern, and outputting the spatiotemporal datacube.

2. The transmission electron microscopy system of claim 1, wherein the pulse generator comprises a photocathode and a pulsed light source for generating an optical pulse towards the photocathode to generate the initial electron pulse.

3. The transmission electron microscopy system of claim 1, wherein the encoding device comprises a mask having the predefined pattern.

4. The transmission electron microscopy system of claim 3, wherein the mask is made of a material opaque to electrons and comprises holes therethrough to form the predefined pattern.

5. The transmission electron microscopy system of claim 1, wherein the shearing device comprises a pair of electrodes connectable to a source of electrical power and configured for applying a time-varying shearing force on electrons contained in the encoded electron pulse.

6. The transmission electron microscopy system of claim 1, wherein the detector comprises charge-coupled device detector for generating the single image of the sample via spatiotemporal integration.

7. The transmission electron microscopy system of claim 1, further comprising a condenser lens device positioned between the pulse generator and the sample for focusing the initial electron pulse onto the sample.

8. The transmission electron microscopy system of claim 7, further comprising a projection lens device positioned between the sample and the encoding device for focusing the transmitted electron pulse onto the detector.

9. The transmission electron microscopy system of claim 1, further comprising a shearing unit positioned between the sample and the encoding device, the shearing unit for temporally shearing the transmitted electron pulse in a further direction to obtain a further electron pulse to be propagated up to the encoding device, the further direction being different from the given direction.

10. The transmission electron microscopy system of claim 9, wherein the further direction is opposite to the given direction.

11. A transmission electron microscopy method for imaging a sample, comprising:
generating an initial electron pulse and propagating the initial electron pulse through the sample, thereby obtaining a transmitted electron pulse;
encoding the transmitted electron pulse according to a predefined pattern, thereby obtaining an encoded electron pulse;
temporally shearing the encoded electron pulse in a given direction, thereby obtaining a given electron pulse;
detecting the given electron pulse, thereby obtaining a single image of the sample;
determining a spatiotemporal datacube from the single image using the predefined pattern; and
outputting the spatiotemporal datacube.

12. The transmission electron microscopy method of claim 11, wherein said generating the initial electron pulse comprises:
generating an optical pulse; and
propagating the optical pulse towards a photocathode, thereby generating the initial electron pulse.

13. The transmission electron microscopy method of claim 11, wherein said encoding the transmitted electron pulse comprises propagating the transmitted electron pulse through a mask having the predefined pattern.

14. The transmission electron microscopy method of claim 13, wherein the mask is made of a material opaque to electrons and comprises holes therethrough to form the predefined pattern.

15. The transmission electron microscopy method of claim 11, wherein said temporally shearing the encoded electron pulse comprises applying a time-varying shear force on electrons contained in the encoded electron pulse by applying a time-varying voltage to a pair of electrodes.

16. The transmission electron microscopy method of claim 11, wherein said detecting the sheared electron pulse is performed using a charge-coupled device configured for generating the single image of the sample via spatiotemporal integration.

17. The transmission electron microscopy method of claim 11, further comprising focusing the initial electron pulse onto the sample.

18. The transmission electron microscopy method of claim 17, further comprising focusing the transmitted electron pulse onto the detector.

19. The transmission electron microscopy method of claim 11, further comprising temporally shearing the transmitted electron pulse in a further direction prior to said encoding, thereby obtaining a given electron pulse, said encoding comprising encoding the given electron pulse and the further direction being different from the given direction.

20. The transmission electron microscopy method of claim 19, wherein the further direction is opposite to the given direction.

* * * * *